(12) United States Patent
Ning

(10) Patent No.: US 7,015,110 B2
(45) Date of Patent: Mar. 21, 2006

(54) METHOD AND STRUCTURE OF MANUFACTURING HIGH CAPACITANCE METAL ON INSULATOR CAPACITORS IN COPPER

(75) Inventor: Xian Jie Ning, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 10/773,727

(22) Filed: Feb. 6, 2004

(65) Prior Publication Data

US 2005/0140010 A1     Jun. 30, 2005

(30) Foreign Application Priority Data

Dec. 30, 2003   (CN)  ........................... 200310122963

(51) Int. Cl.
     *H01L 21/20*   (2006.01)
(52) U.S. Cl. ...................... 438/396; 438/397; 438/653; 438/672; 438/687; 438/738
(58) Field of Classification Search ................ 438/253, 438/254, 256, 396–397, 399, 623–627, 629, 438/633–634, 648, 653, 672, 687–688, 723, 438/725, 738
     See application file for complete search history.

(56) References Cited

U.S. PATENT DOCUMENTS 6,451,667 B1 *   9/2002   Ning ........................... 438/397

(Continued)

FOREIGN PATENT DOCUMENTS

DE           102 47 454 A1 *   10/2001

OTHER PUBLICATIONS

Wolf, Ph.D., Stangley, Richard N. Tauber, Ph.D., "Dry Etching for VLSI Fabrication," Silicon Processing for the VLSI Era—vol. 1: Process Technology, Lattice Press, 1986, pp. 546-550.*

(Continued)

*Primary Examiner*—Mary Wilczewski
*Assistant Examiner*—Toniae M. Thomas
(74) *Attorney, Agent, or Firm*—Townsend and Townsend and Crew LLP

(57) ABSTRACT

An improved semiconductor integrated circuit device structure. The device structure includes a substrate. A thickness of first insulating material is overlying the substrate. A capacitor region within the thickness of the first insulating material and extends from a lower surface of the first insulating material to an upper surface of the first insulating material. The capacitor region includes a width, which extends from the lower surface to the upper surface. The width may vary slightly in some embodiments. The structure includes a contact region overlying the substrate within at least the capacitor region. A lower capacitor plate formed from a plurality of vertical metal structures defined within the capacitor region and connected to the contact region. Each of the plurality of vertical metal structures includes a width and a height. Each of the plurality of vertical metal structures is substantially parallel to each other along a length of the height of each of the vertical metal structures. A barrier metal layer is formed overlying exposed surfaces of each of the plurality of vertical metal structures. A capacitor dielectric layer is overlying each of the exposed surfaces of the barrier layer on each of the vertical metal structures. An upper capacitor plate is formed from metal material within the capacitor region overlying surfaces of the capacitor dielectric layer. The device structure also has a planarized surface formed from the upper capacitor plate in preferred embodiments.

13 Claims, 4 Drawing Sheets

To selectively etch dielectric and strip the residual resist
This process leaves Cu VIAs stand alone Top-view of Fig. 4.

U.S. PATENT DOCUMENTS

| | | | |
|---|---|---|---|
| 6,559,004 B1 * | 5/2003 | Yang et al. | 438/253 |
| 6,593,185 B1 * | 7/2003 | Tsai et al. | 438/253 |
| 6,620,701 B1 * | 9/2003 | Ning | 438/396 |
| 6,638,830 B1 * | 10/2003 | Tsai et al. | 438/397 |
| 6,706,588 B1 * | 3/2004 | Ning | 438/250 |
| 6,765,255 B1 * | 7/2004 | Jin et al. | 257/301 |
| 2003/0073282 A1 * | 4/2003 | Ning | 438/243 |

OTHER PUBLICATIONS

Liu et al., Single-Mask Metal-Insulator-Metal (MIM) Capacitor with Copper Damascene Metallization for Sub-01.18um Mixed Mode Signal and System-On-aChip (SoC) Applications, Proc. 2000, 2000, IITC, pp. 111-113.

* cited by examiner

Figure 1. To form a damascene structure build in IMD and metal Barrier is deposited. An array of VIAs are built for MIMCap Figure 2. Cu seed, Plating and CMP are done the same way as Conventional dual-damascene Cu interconnect processes Figure 3. A layer of dielectric is deposited followed by a lithography Patterning to open the area where MIMCap need to be built.

Figure 4. To selectively etch dielectric and strip the residual resist
This process leaves Cu VIAs stand alone Figure 5. Top-view of Fig. 4.

Figure 6. To conformaly deposit a MIMCap dielectric, a top metal electrode and CMP to have top electrode co-planar with IMD.

METHOD AND STRUCTURE OF MANUFACTURING HIGH CAPACITANCE METAL ON INSULATOR CAPACITORS IN COPPER

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention is directed to integrated circuits and their processing for the manufacture of semiconductor devices. More particularly, the invention provides a method and device for manufacturing a metal inter-connect structure having a metal insulator metal capacitor structure for mixed signal devices. Merely by way of example, the invention has been applied to a copper metal damascene structure such as a dual damascene structure for mixed signal processing devices. But it would be recognized that the invention has a much broader range of applicability. For example, the invention can be applied to microprocessor devices, memory devices, application specific integrated circuit devices, as well as various other interconnect structures.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each procell used in IC fabrication has a limit. That is to say, a given process typically only words down to a certain feature size, and then either the process or the device layout needs to be changed. An example of such a limit is the ability to form interchanging metal and dielectric layers, where the metal layers do not interact with each other in the form of noise.

As merely an example, parallel plate capacitor structures have been used. Such structures have been described in R. Liu et al., titled "Single Mask Metal-Insulator-Metal (MIM) Capacitor with Copper Damascene Metallization for Sub-0.18 µm Mixed Mode Signal and System-On-a-Chip (SoC) Applications" Proc. 2000 IITC, pp. 111–113 (2000). R. Liu et al. generally describes the parallel plate capacitor design. Parallel plate capacitor design often uses two fairly large electrodes and a capacitor dielectric sandwiched in between. Numerous limitations exist. For example, such design often takes a lot of area to provide a desirable capacitance for mixed mode integrated circuit devices. These and other limitations are described throughout the present specification and more particularly below.

From the above, it is seen that an improved technique for processing semiconductor devices is desired.

BRIEF SUMMARY OF THE INVENTION

According to the present invention, techniques including methods for the manufacture of semiconductor devices are provided. More particularly, the invention provides a method and device for manufacturing a metal inter-connect structure having a metal insulator metal capacitor structure for mixed signal devices. Merely by way of example, the invention has been applied to a copper metal damascene structure such as a dual damascene structure for mixed signal processing devices. But it would be recognized that the invention has a much broader range of applicability. For example, the invention can be applied to microprocessor devices, memory devices, application specific integrated circuit devices, as well as various other interconnect structures.

In a specific embodiment, the invention provides a method for manufacturing integrated circuit devices including capacitor structures, e.g., a metal-insulator-metal. The method includes providing a substrate, including an overlying thickness of a first insulating material. The substrate is a semiconductor wafer, such as a silicon wafer or the like. The method includes forming a plurality of openings within the thickness of the first insulating material and a region of the dielectric material. Each of the openings includes a width and a height. The method includes forming a barrier layer overlying an exposed surface of each of the plurality of openings. Each of the openings is filled with a metal layer, which occupies substantially an entire region of each of the openings to form a plurality of metal structures. Each of the metal structures has a width and a height. The method also planarizes a surface of the metal layer. The method also includes patterning the region to-expose each of the metal structures to expose the barrier layer overlying each of the metal structures. A capacitor dielectric layer is formed overlying each of the exposed barrier layer structures. The method also includes forming a second metal layer overlying the capacitor dielectric layer overlying the barrier layer structures. Each of the metal layer structures, overlying capacitor dielectric layer, and the second metal layer forms a capacitor structure. The method planarizes the second metal layer.

In an alternative specific embodiment, the invention provides a method for manufacturing integrated circuit devices including capacitor structures. The method includes providing a semiconductor substrate, e.g., silicon wafer. The method includes forming an overlying thickness of first insulating material on the semiconductor substrate and defining a capacitor region and an interconnect region. Preferably, a capacitor and interconnect are formed with common elements according to the present invention. The method also includes forming a plurality of openings within the thickness of the first insulating material and the capacitor region of the first insulating material. Each of the openings includes a width and a height. The method includes forming a plurality of openings within the thickness of first insulating material in the interconnect region and forming a barrier layer overlying an exposed surface of each of the plurality of openings in the capacitor region and the interconnect region. Each of the openings is filled with a metal material. The metal material occupying substantially an entire region of each of the openings to form a plurality of metal structures. Each of the metal structures has a width and height. The method planarizes a surface region of each of the metal structures. The method includes patterning the capacitor region to expose the barrier layer on each of the metal structures to form an opening within the capacitor region excluding the plurality of metal structures and barrier layer. The plurality of metal structures and barrier layer form a first electrode structure of a capacitor. The method also includes forming an insulating layer overlying each of the exposed barrier layer structures to form a capacitor dielectric for the capacitor and filling the opening within the capacitor region using a second metal layer overlying the insulating layer to form a second electrode structure of the capacitor. The second metal layer is planarized in preferred embodiments.

Still further, the invention provides an improved semiconductor integrated circuit device structure. The device structure includes a substrate. A thickness of first insulating material is overlying the substrate. A capacitor region within the thickness of the first insulating material and extends from a lower surface of the first insulating material to an upper surface of the first insulating material. The capacitor region includes a width, which extends from the lower surface to the upper surface. The width may vary slightly in some embodiments. The structure includes a contact region overlying the substrate within at least the capacitor region. A lower capacitor plate formed from a plurality of vertical metal structures defined within the capacitor region and connected to the contact region. Each of the plurality of vertical metal structures includes a width and a height. Each of the plurality of vertical metal structures is substantially parallel to each other along a length of the height of each of the vertical metal structures. A barrier metal layer is formed overlying exposed surfaces of each of the plurality of vertical metal structures. A capacitor dielectric layer is overlying each of the exposed surfaces of the barrier layer on each of the vertical metal structures. An upper capacitor plate is formed from metal material within the capacitor region overlying surfaces of the capacitor dielectric layer. The device structure also has a planarized surface formed from the upper capacitor plate in preferred embodiments.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
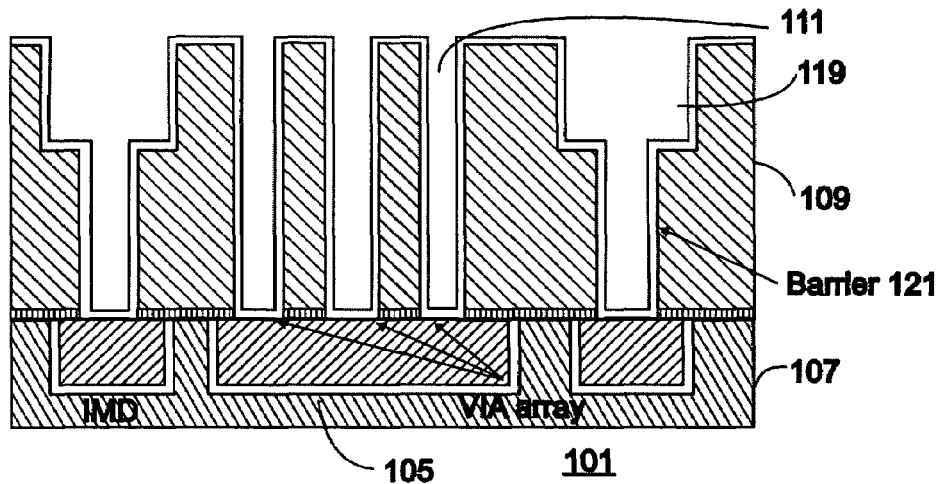
FIGS. 1 through 6 illustrate a simplified method of forming an integrated circuit according to an embodiment of the present invention.

According to the present invention, techniques including methods and resulting structures for the manufacture of semiconductor devices are provided. More particularly, the invention provides a method and device for manufacturing a metal inter-connect structure having a metal insulator metal capacitor structure for mixed signal devices. Merely by way of example, the invention has been applied to a copper metal damascene structure such as a dual damascene structure for mixed signal processing devices. But it would be recognized that the invention has a much broader range of applicability. For example, the invention can be applied to microprocessor devices, memory devices, application specific integrated circuit devices, as well as various other interconnect structures.

A method according to an embodiment of the present invention can be briefly provided as follows:

1. Provide semiconductor substrate;
2. Form dielectric layer overlying surface of a semiconductor substrate;
3. Form conductive layer overlying the dielectric layer;
4. Pattern conductive layer to form an interconnect structure overlying the dielectric layer using damascene process;
5. Form interlayer dielectric layer overlying the conductive layer;
6. Pattern the interlayer dielectric layer to form a plurality of openings, which will be used for the capacitor structures, and a damascene wire structure;
7. Form a barrier metal layer within the openings and the damascene wire structure where the barrier metal layer connects to the patterned conductive layer;
8. Fill the openings overlying the barrier metal layer with a metal material to a height above or about even with a surface level of the interlayer dielectric layer;
9. Planarize excess metal layer;
10. Form photoresist overlying the surface of the planarized layer;
11. Pattern photoresist to form exposed region overlying the surface of the plurality of metal structures;
12. Expose each of the plurality of metal structures, each of the metal structures having a height and a width and exposing the barrier metal layer structures;
13. Form an insulating layer overlying the barrier metal layer structures;
14. Form a metal layer overlying the insulating layer which is overlying the barrier metal layer to form the capacitor structure from the insulating layer and plurality of metal structures;
15. Planarize metal layer;
16. Perform other steps, as desired.

The above sequence of steps provides a method according to an embodiment of the present invention. Other alternatives can also be provided where steps are added, one or more steps are removed, or one or more steps are provided in a different sequence without departing from the scope of the claims herein. As shown, the present method provides a plurality of vertical structures, which define the capacitor structure, and also provides an interconnect structure using similar processes. Further details of the present method can be found throughout the present specification and more particularly below.

A method according to an alternative embodiment of the present invention can be briefly provided as follows:
1. Provide semiconductor substrate;
2. Form dielectric layer overlying surface of a semiconductor substrate;
3. Form conductive layer overlying the dielectric layer;
4. Pattern conductive layer to form an interconnect structure overlying the dielectric layer using damascene process;
5. Form interlayer dielectric layer overlying the conductive layer;
6. Pattern the interlayer dielectric layer to form a plurality of openings, which will be used for the capacitor structures;
7. Form a barrier metal layer within the openings where the barrier metal layer connects to the patterned conductive layer;
8. Form a lower capacitor plate by filling the openings overlying the barrier metal layer with a metal material to a height above or about even with a surface level of the interlayer dielectric layer;
9. Planarize excess metal layer;
11. Form dielectric layer overlying the planarized metal layer and interlayer dielectric;
12. Form photoresist overlying the surface of the planarized layer;
13. Pattern photoresist to form exposed region overlying the surface of the plurality of metal structures;
14. Remove a portion of the interlayer dielectric within the capacitor region to expose each of the plurality of metal structures, including the barrier layer portions;
15. Form an insulating layer overlying the barrier metal layer structures to define a capacitor dielectric;
16. Form a metal layer overlying the insulating layer which is overlying the barrier metal layer to define the upper electrode of the capacitor;
17. Planarize metal layer;
18. Perform other steps, as desired.

The above sequence of steps provides a method according to an embodiment of the present invention. Other alternatives can also be provided where steps are added, one or more steps are removed, or one or more steps are provided in a different sequence without departing from the scope of the claims herein. As shown, the present method provides a plurality of vertical structures, which define the capacitor structure. Further details of the present method can be found throughout the present specification and more particularly below.

FIGS. 1 through 6 illustrate a simplified method of forming an integrated circuit according to an embodiment of the present invention. These diagrams are merely examples, which should not unduly limit the scope of the claims herein. One of ordinary skill in the art would recognize many variations, modifications, and alternatives. As shown, the method begins providing a substrate 101. The substrate can be a silicon wafer, a multilayered structure, including silicon on insulator, and the like. The method includes forming an insulating layer (not shown in FIG. 1: e.g., silicon dioxide, fluorinated silicon oxide, black diamond a trade name by Applied Materials, Inc., SiLK a trade name by Dow chemical or other dielectric materials) overlying the substrate. A dielectric layer 105 is formed overlying the insulating layer. The dielectric layer is patterned and metal material 107 fills the patterned dielectric material. A barrier metal layer may be formed between the metal fill material and the patterned dielectric material. Here, the metal material can be copper or the like and the patterned dielectric material can be silicon dioxide, fluorinated silicon oxide, black diamond a trade name by Applied Materials, Inc., SiLK a trade name by Dow chemical and other dielectric materials. The barrier metal layer can be titanium, titanium nitride, tantalum, tantalum nitride, tungsten and its alloy, Mo, WNi and MoN. A planarizing method flattens or planarizes an upper surface of the metal and dielectric material layers. Of course, one of ordinary skill in the art would recognize many variations, alternatives, and modifications.

The method also includes forming an overlying thickness 109 of first insulating material, which serves as an inter layer dielectric. A barrier metal layer and/or a capping layer may be formed overlying the metal layer in certain embodiments. The method includes forming a plurality of openings 111 within the thickness of the first insulating material and a region of the dielectric material. Each of the openings includes a width and a height. Preferably, certain openings 111 are within a region that will define a capacitor structure. Additionally, certain openings 119 are formed within a region that will define an interconnect structure. The method includes forming a barrier layer 121 overlying an exposed surface of each of the plurality of openings. The barrier metal layer can any suitable material such as titanium, titanium nitride, tantalum, tantalum nitride, tungsten and its alloy, Mo, WN, and MoN.

Figure 2:
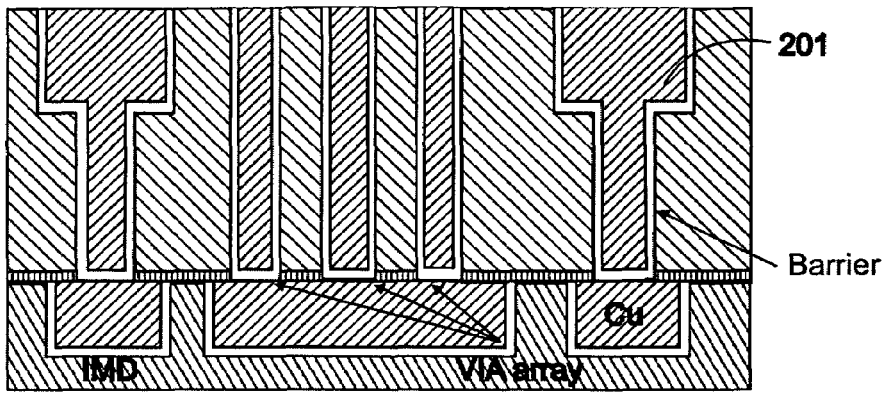
Figure 3:
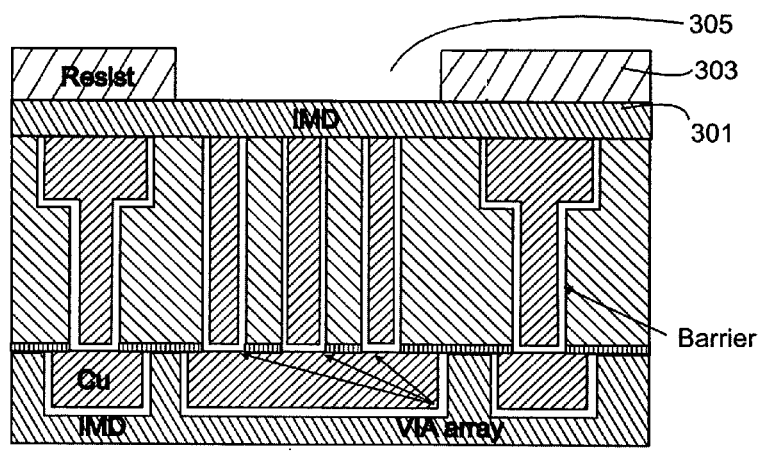

Referring to FIG. 2, each of the openings is filled with a metal layer 201, which occupies substantially an entire region of each of the openings to form a plurality of metal structures. Each of the metal structures has a width and height. The method also planarizes a surface of the metal layer 201. Preferably, the method uses similar techniques as those in a conventional dual damascene structure for copper interconnects or the like. As shown, the method forms the capacitor structure and interconnect structure using the same process steps at this point.

Figure 4:
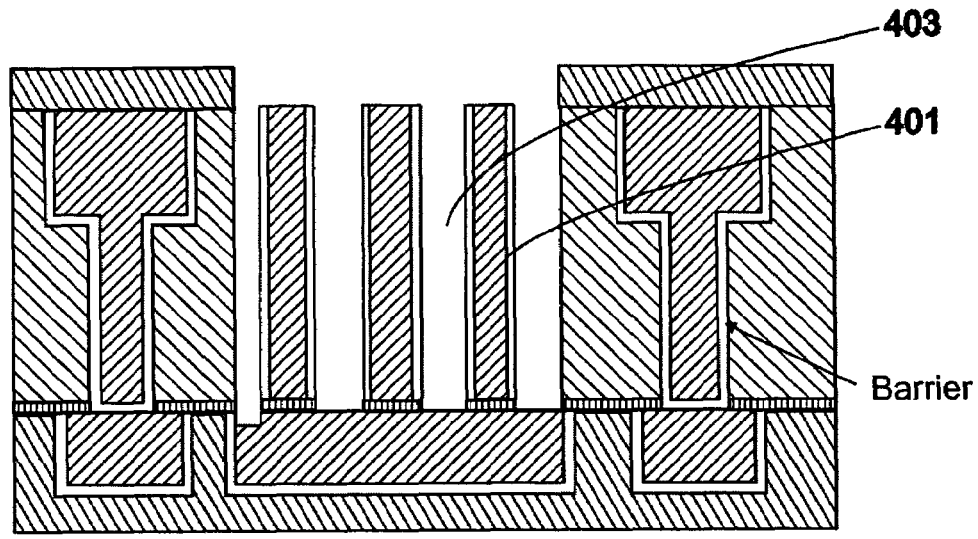
Figure 5:
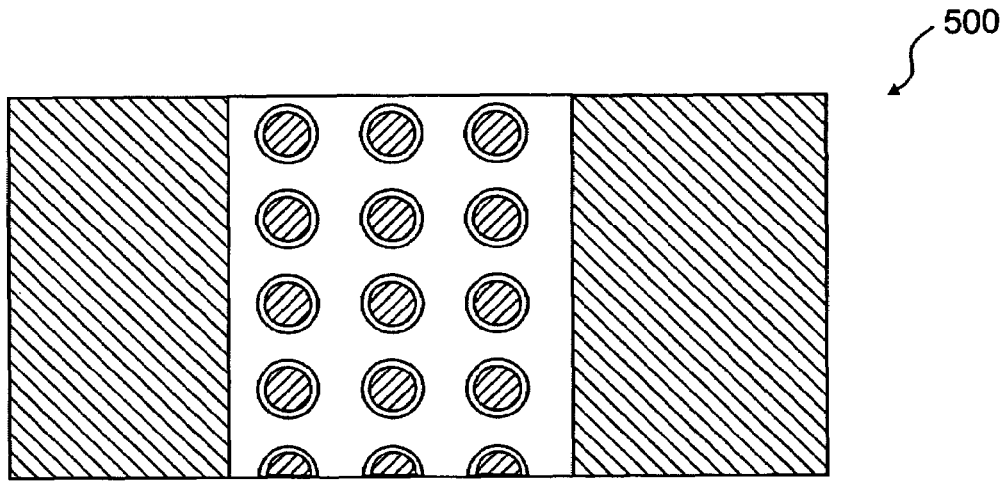

The method also includes patterning the capacitor region 305 to expose each of the metal structures. Here, the method deposits a dielectric layer 301 overlying the surface of the metal via structures. A photoresist material 303 is formed overlying the surface of the dielectric layer, which serves as a hard mask. The photoresist material is exposed and patterned. A selective etching process exposes 401 the barrier layer overlying each of the metal structures, as shown in FIG. 4. An opening 403 forms within the capacitor region, excluding the metal structures. The selective etching process uses $C_4F_8$, CO, $O_2$, $CF_4$, $N_2$, Ar, $SF_6$, $CHF_3$, but can also be $CH_3F$, $C_4F_6$, $C_2F_6$, or a combination of some of them. Subsequently, the photoresist material is stripped. Of course, one of ordinary skill in the art would recognize many variations, modifications, and alternatives. Referring to FIG. 5, a top-view diagram 500 is also shown. Here, barrier metal layer surrounds each of the metal structures. Each of the metal structures is free standing and has a free end with a flat surface. Each of the metal structures is substantially parallel to each other in height and is also provided in an array spatial configuration. A bottom portion of each of the metal structures connects to a contact region of underlying metal.

Figure 6:
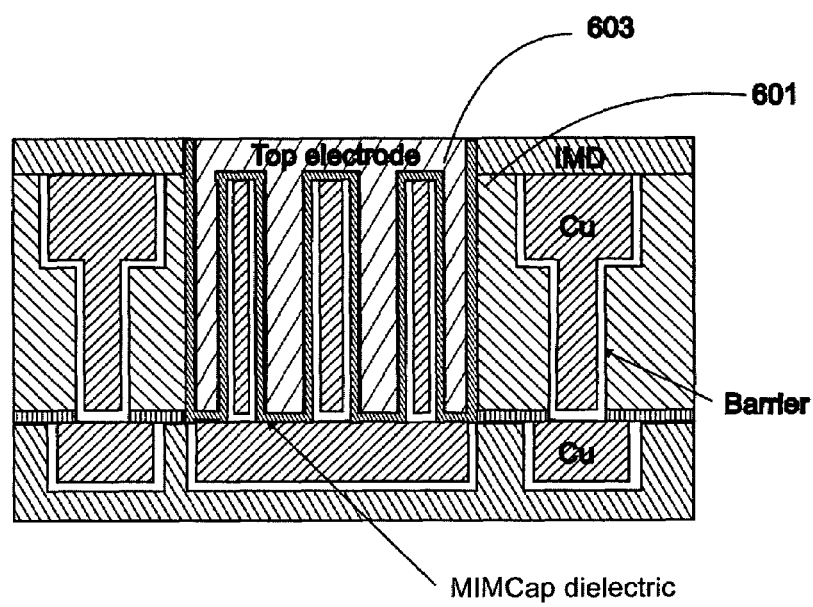

The method includes forming a capacitor dielectric layer 601 overlying each of the exposed barrier layer structures, as shown in FIG. 6. The dielectric layer can be PE CVD nitride or other low temperature dielectric, which is conformal. Preferably, the dielectric layer is PE CVD silicon nitride, which has a thickness of 600–800 Å for a 0.18 micron design rule. Next, the method includes forming a second metal layer 603 overlying the capacitor dielectric layer overlying the barrier layer structures. The second metal layer is provided as a fill material. Such material is preferably copper, which is plated or deposited. The copper is then planarized. Depending upon the embodiment, there can be other modifications, variations, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing integrated circuit devices including capacitor structures, the method comprising:
   providing a substrate, including an overlying thickness of first dielectric material;
   forming a plurality of openings within the thickness of the first dielectric material, each of the openings including a width and a height;
   forming a barrier layer overlying an exposed surface of each of the plurality of openings;
   filling each of the openings with a metal layer, the metal layer occupying substantially an entire region of each of the openings to form a plurality of metal structures, each of the metal structures having a width and height;
   planarizing a surface of the metal layer;
   patterning a region to expose each of the metal structures to expose the barrier layer overlying each of the metal structures, thereby forming an array;
   forming a capacitor insulating layer overlying the array; and
   forming a second metal layer overlying the capacitor insulating layer, whereupon each of the metal layer structures, overlying capacitor insulating layer, and second metal layer form a capacitor structure; and
   planarizing the second metal layer.

2. The method of claim 1 wherein the metal structures comprise substantially copper material or tungsten or aluminum.

3. The method of claim 1 wherein the insulating layer is silicon nitride or PECVD silicon nitride.

4. The method of claim 1 wherein the insulating layer is maintained at a temperature below 400 degrees Celsius.

5. The method of claim 1 further comprising forming a dual damascene interconnect structure within the first insulating material concurrently with one or more of the steps of forming the integrated circuit.

6. The method of claim 1 wherein the barrier metal layer comprises tantalum nitride.

7. The method of claim 1 wherein the second metal layer comprises tungsten, the tungsten filling the region occupied by the plurality of metal structures.

8. The method of claim 1 wherein the patterning comprises selective removal of a portion of the first insulating material to expose the plurality of metal structures.

9. The method of claim 8 wherein the selective removal uses an etchant selected from $C4F_8$, $CO$, $O_2$, $CF_4N_2$, $ArSF_6$, $CHF_3$, $CH_3F$, $C_4F_6$, and $C_2F_6$.

10. The method of claim 1 wherein the integrated circuit is a mixed mode signal device.

11. A method for manufacturing integrated circuit devices including capacitor structures, the method comprising:
    providing a semiconductor substrate;
    forming an overlying thickness of first insulating material on the semiconductor substrate;
    defining a capacitor region and an interconnect region;
    forming a plurality of openings within the thickness of the first insulating material and the capacitor region of the first insulating material, each of the openings including a width and a height;
    forming a plurality of openings within the thickness of first insulating material in the interconnect region;
    forming a barrier layer overlying an exposed surface of each of the plurality of openings in the capacitor region and the interconnect region;
    filling each of the openings with a metal material, the metal material occupying substantially an entire region of each of the openings to form a plurality of metal structures, each of the metal structures having a width and height;
    planarizing a surface region of each of the metal structures;
    patterning the capacitor region to expose the barrier layer on each of the metal structures to form an opening within the capacitor region excluding the plurality of metal structures and barrier layer, the plurality of metal structures and barrier layer forming a first electrode array structure of a capacitor;
    forming an insulating layer overlying each of the exposed barrier layer structures to form a capacitor dielectric for the capacitor;
    filling the opening within the capacitor region using a second metal layer overlying the capacitor insulating layer to form a second electrode structure of the capacitor; and
    planarizing the second metal layer.

12. The method of claim 11 wherein the second metal layer comprises a copper material.

13. The method of claim 11 wherein the metal material is copper fill material.

* * * * *